United States Patent
Gerber et al.

(10) Patent No.: US 8,574,967 B2
(45) Date of Patent: Nov. 5, 2013

(54) METHOD FOR FABRICATING ARRAY-MOLDED PACKAGE-ON-PACKAGE

(71) Applicant: Texas Instruments Incorporated, Dallas, TX (US)

(72) Inventors: Mark A. Gerber, Plano, TX (US); David N. Walter, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/789,109

(22) Filed: Mar. 7, 2013

(65) Prior Publication Data

US 2013/0189814 A1 Jul. 25, 2013

Related U.S. Application Data

(62) Division of application No. 13/050,177, filed on Mar. 17, 2011, which is a division of application No. 11/750,757, filed on May 18, 2007, now abandoned.

(51) Int. Cl.
*H01L 21/00* (2006.01)

(52) U.S. Cl.
USPC ............ 438/126; 438/112; 438/124; 438/127; 264/272.17

(58) Field of Classification Search
USPC ............ 438/126; 264/272.13–272.14, 272.17
See application file for complete search history.

(56) References Cited

U.S. PATENT DOCUMENTS 6,247,229 B1 * 6/2001 Glenn ........................... 29/841

\* cited by examiner

*Primary Examiner* — Allen Parker
(74) *Attorney, Agent, or Firm* — Steven A. Shaw; W. James Brady; Frederick J. Telecky, Jr.

(57) ABSTRACT

An improved semiconductor device package is manufactured by attaching semiconductor chips (130) on an insulating substrate (101) having contact pads (103). A mold is provided, which has a top portion (210) with metal protrusions (202) at locations matching the pad locations. The protrusions are shaped as truncated cones. The substrate and the chips are loaded onto the bottom mold portion (310); the mold is closed by clamping the top portion onto the bottom portion so that the protrusions approach the contact pads. Encapsulation compound is introduced into the cavity and the protrusions create apertures through the encapsulation compound towards the pad locations.

9 Claims, 9 Drawing Sheets

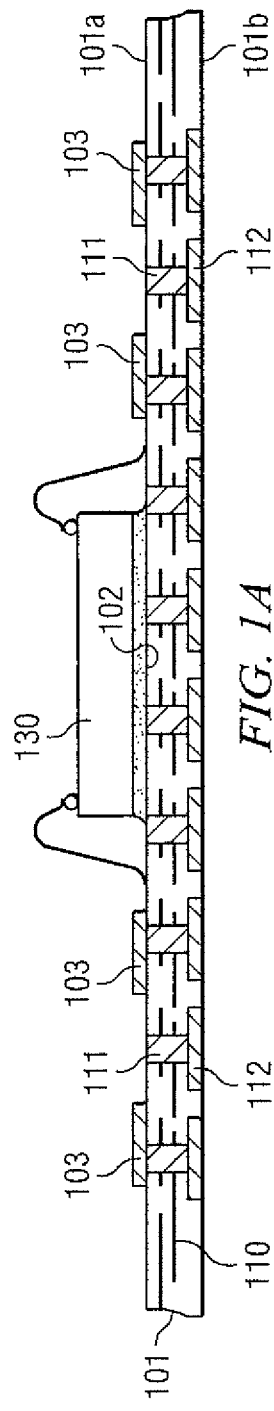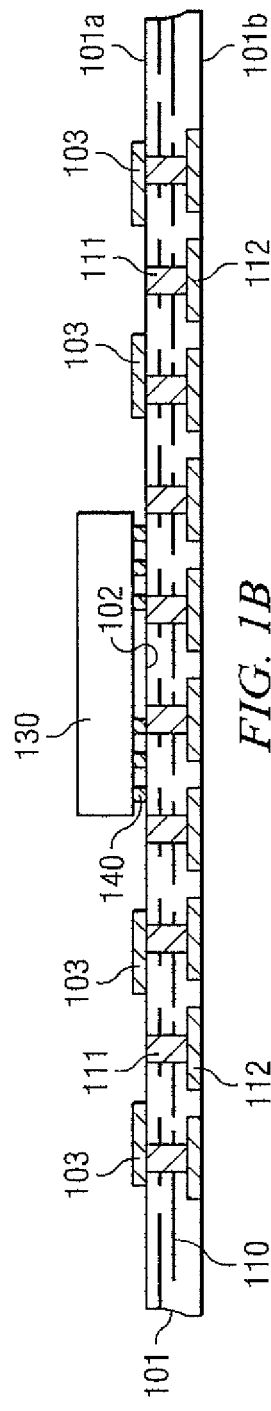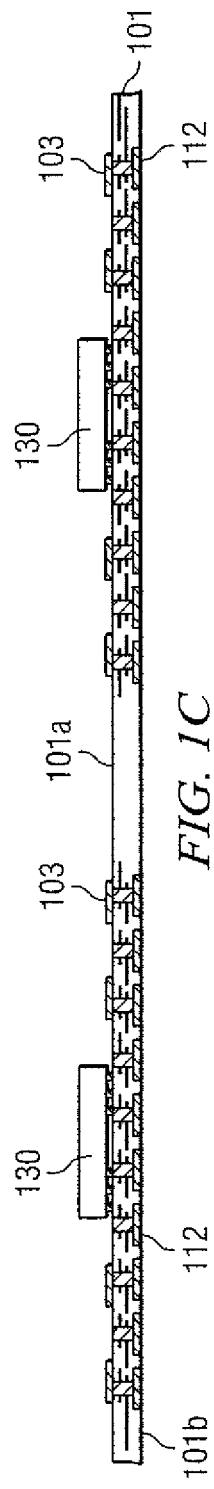

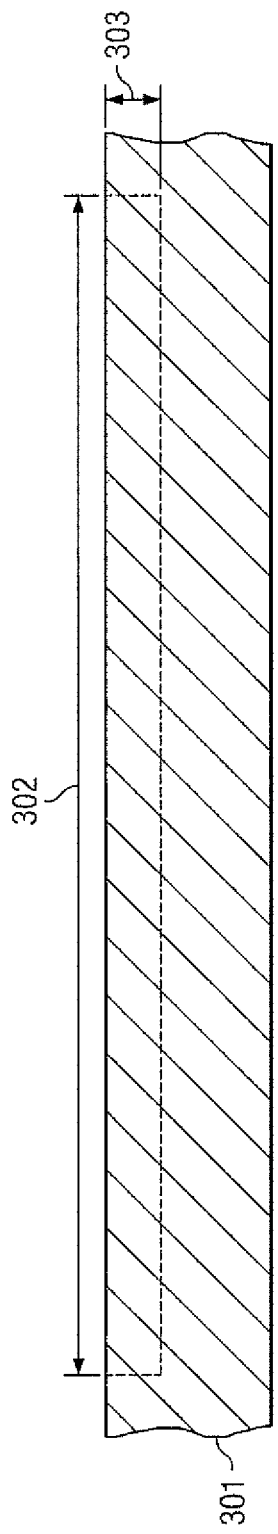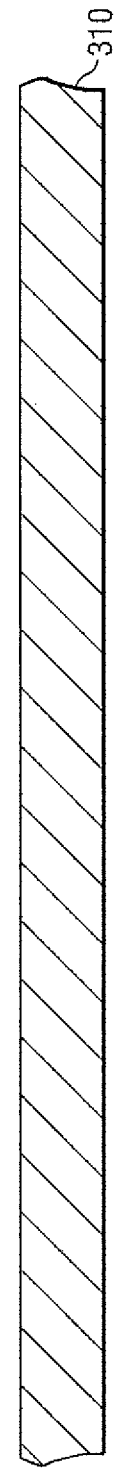
FIG. 3A
FIG. 3B

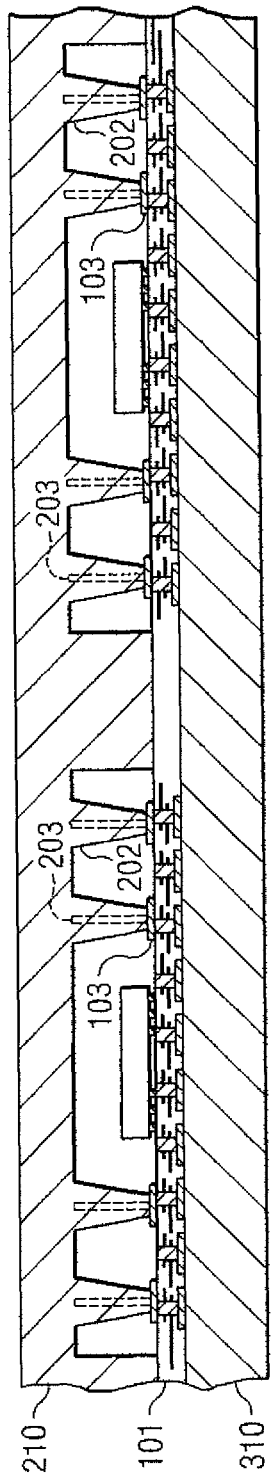
FIG. 5
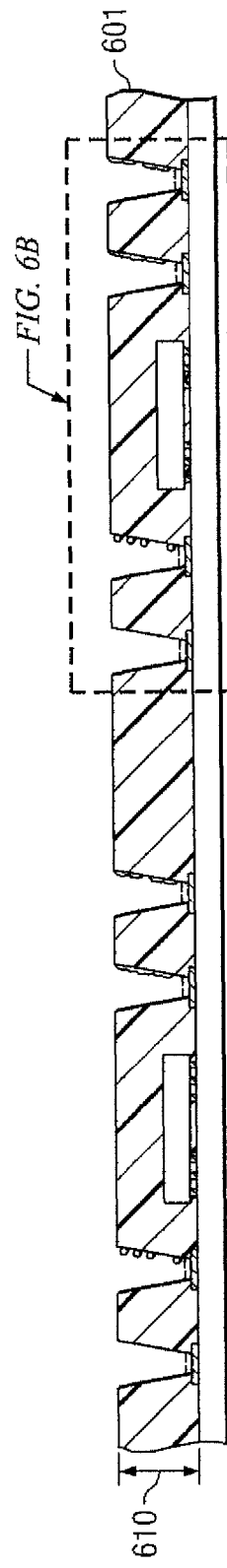
FIG. 6A
FIG. 6B

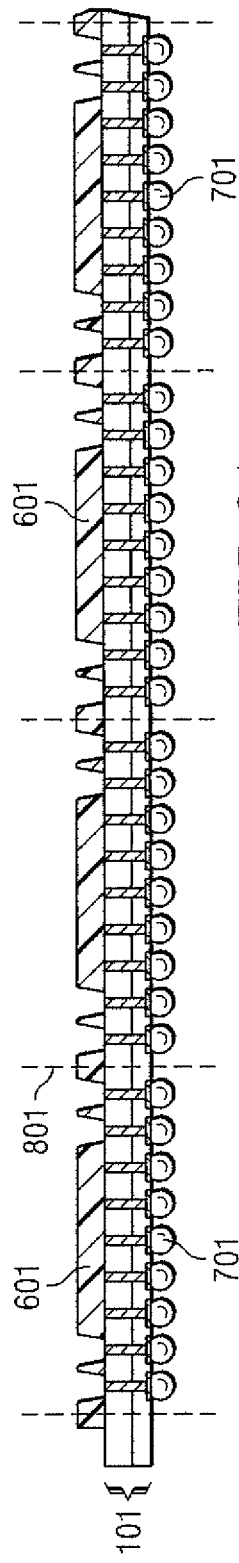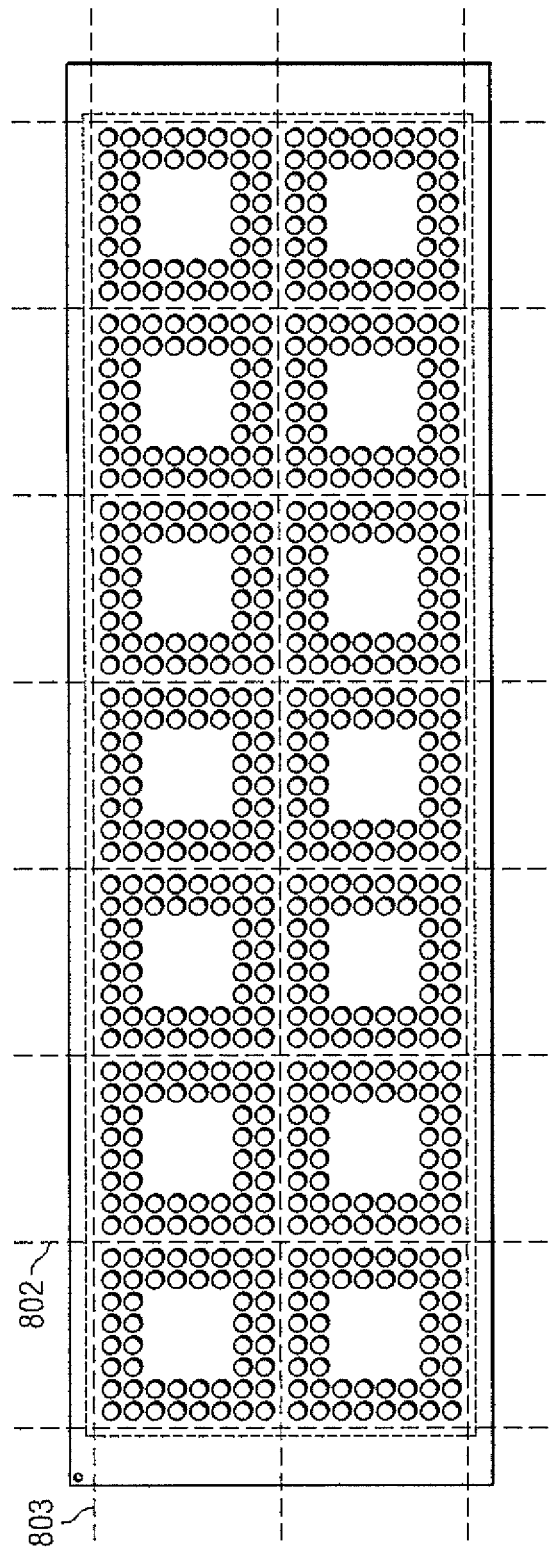
FIG. 8A
FIG. 8B

METHOD FOR FABRICATING ARRAY-MOLDED PACKAGE-ON-PACKAGE

This is a divisional application of application Ser. No. 13/050,177 filed Mar. 17, 2011 which is a divisional application of application Ser. No. 11/750,757 filed May 18, 2007, the contents of which are herein incorporated in its entirety.

FIELD OF THE INVENTION

The present invention is related in general to the field of semiconductor devices and processes and more specifically to the structure and fabrication method of low-profile, vertically integrated package-on-package integrated circuit assemblies.

DESCRIPTION OF THE RELATED ART

The thickness of today's semiconductor package-on-package products is the sum of the thicknesses of the semiconductor chips, electric interconnections, and encapsulations, which are used in the individual devices constituting the building-blocks of the products. This simple approach, however, is no longer acceptable for the recent applications especially for hand-held wireless equipments, since these applications place new, stringent constraints on the size and volume of semiconductor components used for these applications.

Furthermore, while the market place renewed a push to shrink semiconductor devices both in two and in three dimensions, the miniaturization effort included packaging strategies for thinner semiconductor devices as well as electronic systems. This trend to reduce product thickness initiated an increasing tendency to have product warpage problems, especially in thin assemblies, caused by the mismatch in the coefficients of thermal expansion (CTE) between the semiconductor chip, the plastic substrates, the molding compound, the solder balls, and the printed circuit board. For instance, with silicon as the semiconductor material and plastic FR-4 as substrate material, the difference in CTE is about an order of magnitude. Warpage is aggravated by repeated temperature cycles and solder reflows. Warpage can lead to some of the most debilitating problems encountered by semiconductor assemblies such as the fracture and separation of solder joints, or the separation of materials followed by moisture ingress.

SUMMARY OF THE INVENTION

Applicants recognize an existing need to shrink semiconductor devices both in two and in three dimensions, especially for a device-stacking and package-on-package method for semiconductor devices as well as electronic systems. Specifically, applicants recognize an existing need to design production equipment such as molds, to fabricate devices directly usable for assembling package-on-package the products.

The invention solves the problem by constructing one mold portion with contours so that the molded device will offer direct coupling with another device to form a package-on-package product. In addition, the new fabrication method is low-cost and simplified, and the products provide improved testability and thus yield. Using these contoured molds, stacking chips and packages will shorten the time-to-market of innovative products such as vertically integrated semiconductor systems, which utilize available chips of various capabilities (for example processors and memory chips), eliminating the wait for a redesign of chips.

Based on the contoured mold equipment, package-on-package devices can be produced with excellent electrical performance, mechanical stability free of warping, and high product reliability. Further, it is a technical advantage that the fabrication method is flexible enough to be applied for different semiconductor product families and a wide spectrum of design and process variations.

One embodiment of the invention is a method for fabricating a semiconductor device. A semiconductor chip is assembled on a sheet-like insulating substrate integral with two or more patterned layers of conductive lines and conductive vias and contact pads in pad locations. A mold is provided, which has a top portion with metal protrusions at locations matching the pad locations; the protrusions are shaped as truncated cones of a height suitable to approach the pad metal surface in the closed mold cavity. The bottom mold portion is featureless. The substrate with the chip is loaded onto the bottom mold portion; the mold is closed by clamping the top portion onto the bottom portion so that the protrusions are aligned with the contact pads, approaching the pad surface. A cavity is thus formed by the top portion. After pressuring encapsulation compound into the cavity, the mold is opened. The encapsulation of the molded device has apertures to the pad locations. Finally, any residual compound formed on the pads is removed to expose the metal surface.

The protrusions approach the pad metal surface in the closed cavity to a distance between 0 and 100 µm. The compound formed in that distance can be removed either by shining laser light into the compound apertures, depositing compound particles on the sidewalls; or by a plasma clean-up process, leaving a roughened surface on the aperture sidewalls; or by a chemical etch process, leaving a compound undercut next to the pad metal surface.

The mold apertures may be filled with solder material contacting the pad metal surface, or they may serve to attach another semiconductor device with solder bodies, creating a package-on-package semiconductor assembly.

Another embodiment of the invention is a mold with top and bottom portions forming a cavity for holding semiconductor devices, wherein the device includes a semiconductor chip assembled on a sheet-like insulating substrate having contact pads in pad locations and with a metal surface. The mold is operable to be closed by clamping the top portion onto the bottom portion. The top portion includes metal protrusions at locations matching the pad locations; the protrusions are shaped as truncated cones of a height suitable to approach the pad metal surface in the closed cavity. The cones are angled with a range of about 10 to 30 degrees from vertical. Furthermore, the protrusions may optionally include a ridge operable to create a gas release channel in the aperture of the contact pads.

Another embodiment of the invention is a semiconductor device including a sheet-like insulating substrate with a perimeter, a first (top) surface with a chip assembly site and contact pads in pad locations and with a metal surface, and a second (bottom) surface. A semiconductor chip is assembled (by wire bonding or by flip-chip) on the assembly site. An encapsulated region, located only on the top substrate and extending to the substrate perimeter, encloses the chip in compound and has contact apertures at the pad locations for permitting external communication with the metal surfaces; the apertures may include sidewall surfaces with compound structures modified from its smooth-molded character by a metal clean-up process.

The compound structures on the aperture sidewalls may include thermally modified compound particles indicative of a laser process used for exposing the pad metal. Alternatively, the aperture sidewalls may have a roughened surface indicative of a plasma clean-up process used for exposing the pad metal. Or alternatively, the aperture sidewalls have indications of a chemical etch process used for exposing the pad metal.

The device further may have elongated grooves in the contact apertures operable as gas release channels. Solder material may be in the apertures, contacting the pad metal surface. Alternatively, another semiconductor device with solder balls can be attached to the first substrate surface by contacting the pad surfaces with the solder balls and thus creating a package-on-package semiconductor assembly. In addition, solder bodies may be attached to the second substrate surface.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 1A to 7 illustrate certain process steps for fabricating an array-molded semiconductor device according to an embodiment of the invention.

FIG. 1A is a schematic cross section of a substrate with contact pads and a semiconductor chip assembled by wire bonding.

FIG. 1B is a schematic cross section of a substrate with contact pads and a semiconductor chip assembled by flip-chip technology.

FIG. 1C is a schematic cross section of a sheet-like substrate with contact pads and a plurality of chips flip-assembled for array processing.

FIG. 3A shows a schematic cross section of the bottom portion of a mold.

FIG. 3B shows a schematic cross section of the bottom portion of a mold intended for array-molding.

FIG. 4 illustrates a schematic cross section of the open mold according to an embodiment of the invention, loaded with a substrate assembled with semiconductor devices.

FIG. 5 shows a schematic cross section of the closed mold according to an embodiment of the invention, loaded with a substrate assembled with semiconductor devices.

FIG. 6A illustrates a schematic cross section of a molded semiconductor array after removal from the mold.

FIG. 7 is a schematic cross section of a discrete device after removing any molding compound from the contact pads, filling an aperture with solder, and attaching solder bodies for external communication.

FIG. 8A shows a schematic cross section of a finished array with features according to the invention.

FIG. 8B depicts a schematic top view of a finished array, molded according to the invention, before singulation.

DETAILED DESCRIPTION OF THE PREFERRED EMBODIMENTS

Figure 2A:
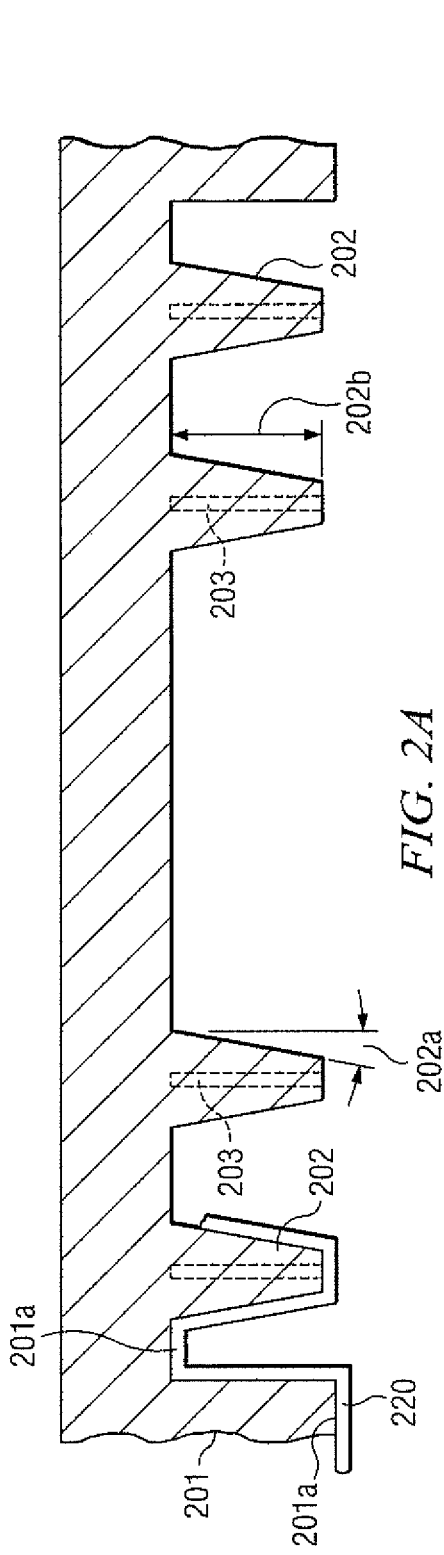
FIG. 2A shows a schematic cross section of the top portion of a mold with structural features according to the invention.

FIGS. 1A through 7 illustrate schematically the steps of one embodiment of the present invention, a method for array-molding semiconductor devices. The steps shown in FIGS. 1A and 1B show the assembly of a semiconductor chip on a substrate by wire bonding (FIG. 1A) and by flip-chip technology (FIG. 1B); FIG. 1C exemplifies a portion of an array of chips assembled by flip-chip. A sheet-like substrate 101 with insulating core (for example, plastic, glass-fiber reinforced, ceramic) is integral with two or more patterned layers of conductive lines and conductive vias 111 (preferably copper) and contact pads in pad locations. Lines 110 do not reach beyond the boundaries of substrate 101. Substrate 101 has a first surface 101a and a second surface 101b, and a preferred thickness range from 0.2 to 0.5 mm. The first surface 101a includes chip assembly sites 102 and contact pads 103 in pad locations. The metal of the contact pads is preferably copper with a solderable surface (for example, including a layer of gold or palladium). Second surface 101b also has pads 112 with a solderable surface.

A plurality of semiconductor chips 130 is provided. In order to attach and electrically connect the chips, they are assembled on each assembly site either by adhesive attachment and wire bonding, or by flip-chip connection. For flip-attachment, the connecting metal bumps 140 may be made of solder, gold, or copper.

As illustrated in FIG. 2A to 3B, in the next process step a mold made of steel or another suitable material is provided, which allows the encapsulation of a single unit or an array of units. The mold has a top portion manufactured to include recesses suitable for a cavity, and a bottom portion; when closed, the mold is forming a cavity for holding semiconductor devices. In FIG. 2A, the top portion is intended to process a single unit and is designated 201; in FIG. 2B, the top portion is constructed for an array of units to be processed together as a batch. In FIG. 3A, the bottom portion is intended to process a single unit and is designated 301; in FIG. 2B, the bottom portion is constructed for an array of units to be processed together.

The top portion 201 includes protrusions 202 at locations matching the pad locations of the device shown in FIGS. 1A and 1B; the bottom portion 301 is without corresponding protrusions. The protrusions are preferably shaped as truncated cones, with the cone surface angled within a preferred range from about 10 to 30 degrees from vertical. The angle is designated 202a in FIG. 2A. Furthermore, the protrusions preferably may have a ridge 203, which may extend along the whole angled side of the cone. Ridge 203 is operable to create a groove or channel in the molded part, which may provide release of gas in the solder ball attachment process, or help in the solder paste reflow process.

The height 202b of the protrusion is selected to be suitable to approach the substrate pad metal (103 in FIGS. 1A and 1B) in the closed mold. Preferably, the protrusion should approach the pad metal surface in the closed mold to a distance between 0 and about 100 μm. More preferably, height 202b of the protrusion is sufficient to touch the pad metal surface in the closed mold.

The bottom portion 301 in FIG. 3A and 310 in FIG. 3B of the mold has no protrusions; it is featureless and preferably flat. For some individual devices, it may be an advantage to recess a portion outlined by length 302 and depth 303 sufficient to accommodate the substrate of a discrete device, but for array processing, a featureless flat bottom mold portion is preferable.

In the next process step (see FIG. 4), the substrate 101 with the assembled chips 130 is loaded onto the bottom mold portion 310. The second substrate surface 101b is rested on mold portion 310, and the first substrate surface 101a with the contact pads 103 is positioned away from the bottom mold portion 310. Protrusions 202 of the top mold portion 210 are aligned with the respective contact pads 103 of substrate 101.

FIG. 5 shows the next process step of closing the mold by clamping the top portion 210 onto the bottom portion 310 so that the protrusions 202 are aligned with the contact pads 103, approaching or touching the pad surface. The top portion 210 resting on the flat bottom portion 310 forms the cavity of the mold for holding the semiconductor devices. Preferably, the protrusions touch the contact pads; however, material or alignment tolerances may cause a residual distance between 0 and about 100 μm between the protrusion and the pad. FIG. 5 also shows the respective ridge 203 for each protrusion 202.

In order to avoid any residual distance between protrusions and pads, causing a gap between protrusions and pads, and thus to avoid any bleeding of mold compound into the gap, an alternative method includes the step of placing a thin sheet of compliant, inert polymer over the surface of the complete top mold portion. The polymer is selected to tolerate significant pressure from the protrusions clamped against the pads. The sheet may have a chemical composition to be either dissolved into the molding compound and become part of the molded encapsulation, or, preferably, remain a coherent sheet which can be readily peeled off the top mold portion, after the mold is opened again.

Next, encapsulation material such as epoxy-based and filler-loaded molding compound is pressured into the cavity to fill the cavity; the runners for supplying the compound, and the gates needed for entering the cavity and controlling the compound flow, are not shown in FIG. 5. By this transfer molding step, encapsulations for the devices of the array are created.

Figure 6B:
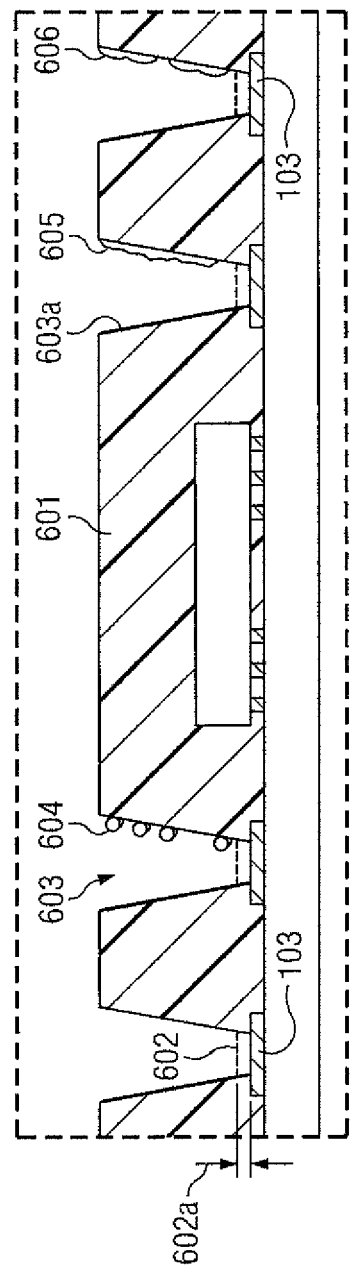
FIG. 6B shows a magnified schematic cross section of a molded unit after removal from the mold and singulation from the array.

After partially polymerizing the compound 601, the mold is opened and the substrate together with the encapsulated array of chips is removed from the mold; FIG. 6A illustrates the encapsulated array, and FIG. 6B shows an enlarged view of one unit. Subsequently, compound 601 is fully polymerized. For many device types, the thickness 610 of the molded encapsulation is between 0.6 and 0.7 mm. FIGS. 6A and 6B show that the encapsulation has apertures 603 to the pad locations.

FIG. 6B indicates by dashed contour 602 any residual encapsulation formed on the contact pads 103. These thin deposits (thickness 602a between 0 and about 100 μm) have to be removed to expose the clean metal surface of pad 103. At least three methods are suitable to remove these unwanted encapsulation layers.

The first method employs drilling or vaporizing by laser light. A focused laser beam shines into the encapsulation aperture 603, removes the compound layer while forming particles 604 in a thermal process, and deposits these particles on the otherwise smooth sidewalls 603a; particles 604 attest to the thermal process used to clean up the pads. The second method employs a plasma clean-up process; the plasma leaves a roughened surface 605 on the aperture sidewalls 603a. The third method employs a chemical etch process, which leaves a surface structure 606 recognizable by one skilled in the art. All three methods are material-sensitive and thus controllable to stop at the metal surface of the contact pads.

When the compliant inert film is employed, which can be peeled off after the molding process (see above), the pad metal surfaces remain clean throughout the molding process and consequently no clean-up step is necessary.

Figure 7:
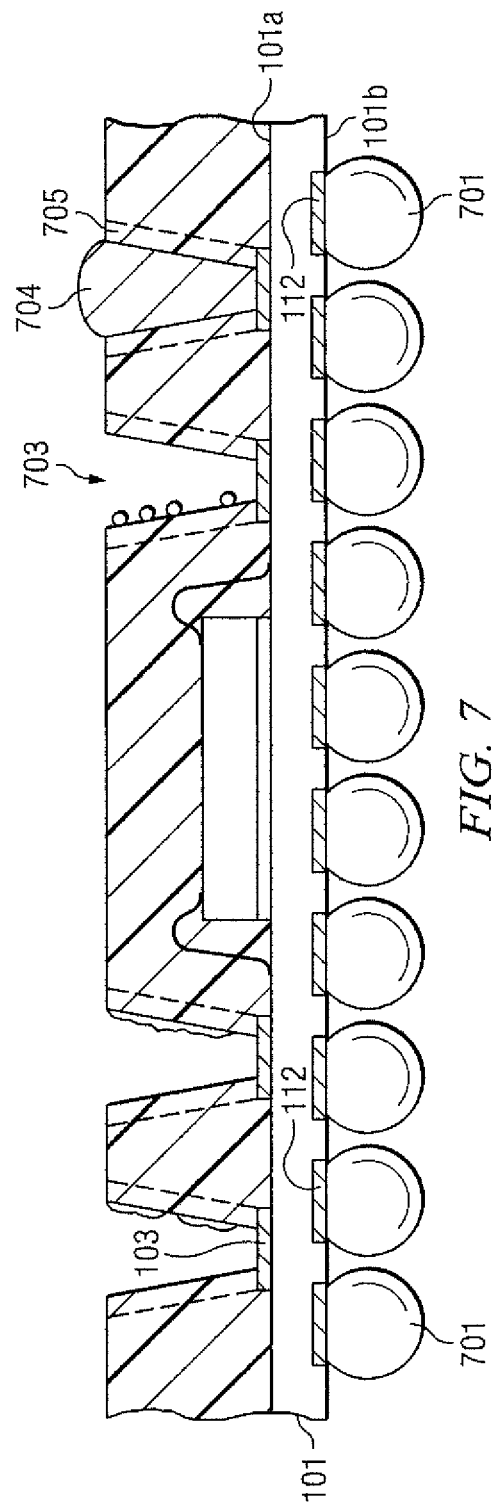

In an additional process step, reflow bodies such as solder balls 701 are attached to the attachment pads 112 (see FIGS. 1A and 1B) on the second substrate surface 101b. This step is illustrated in FIG. 7, showing a magnified portion of the array (it should be noted that in the example of FIG. 7, wire bonding has been employed to assemble the chip on the first substrate surface 101a).

In an optional process step, the mold apertures 703 may be filled with solder paste 704, which contacts the surface of pad metal 103. During the reflow step of the paste, grooves 705 may help to separate the flux-rich part form the solder-rich part.

Figure 8C:
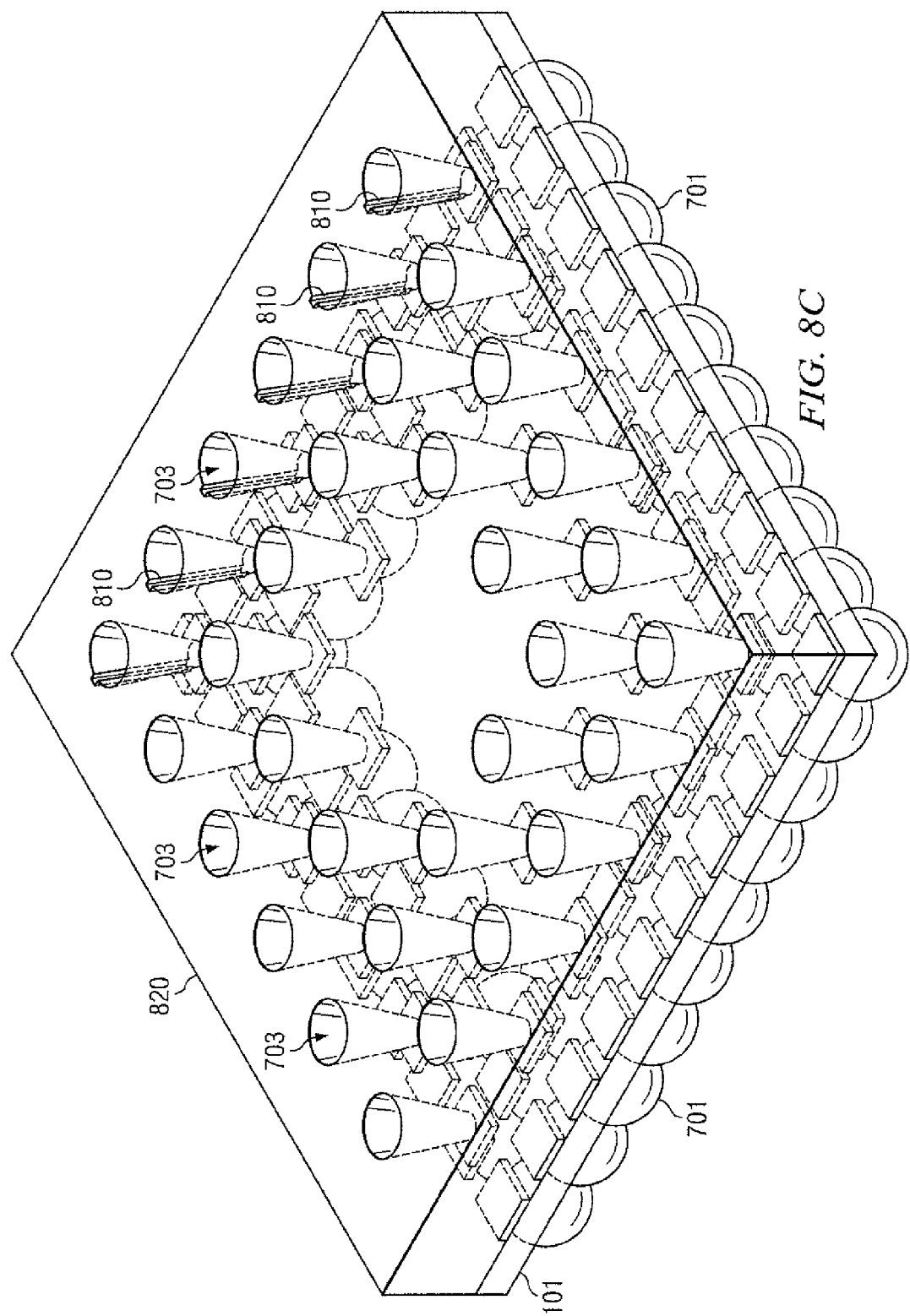
FIG. 8C shows a schematic perspective view of a discrete unit singulated from the molded array with features according to the invention.

FIGS. 8A, 8B, and 8C depict the singulation step. The dashed lines 801 (in the cross section of FIG. 8A), 802 and 803 (in the top view of FIG. 8B) indicate saw lines of saws, which cut through the mold compound 601 and the substrate 101 to singulate discrete units from the sheet-like substrate of the array. Due to the sawing process step, the individual units have recognizable saw marks on their sides.

A discrete unit is illustrated in FIG. 8C in an X-ray view, which emphasizes the apertures 703 to the contact pads, but omits the encapsulated assembled chip for clarity reasons (not to scale). In addition, the gas release channels 810 have been omitted for all apertures except for one row of apertures.

Figure 9:
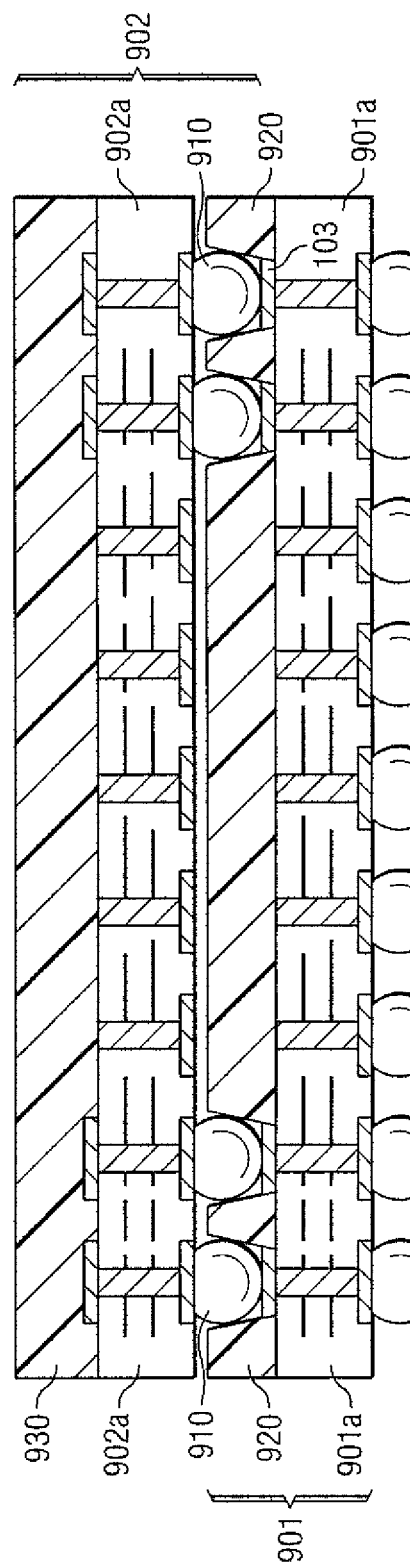
FIG. 9 illustrates a schematic cross section of another embodiment of the invention, wherein a second semiconductor device with solder bodies is attached to the first device so that the aperture-exposed pads of the first device are contacted by the solder bodies of the second device, creating a package-on-package semiconductor assembly.

The gas release channels help to prevent the trapping of air and gas, when another device 902 with solder bodies 910 is attached to the first device 901 and the apertures are filled with solder to contact the exposed surfaces of the contact pads 103. FIG. 9 illustrates a resulting package-on-package semiconductor assembly.

Figure 2B:
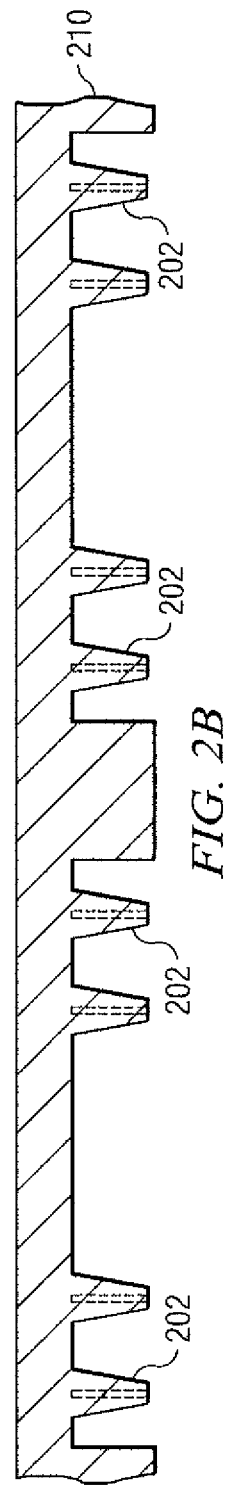
FIG. 2B shows a schematic cross section of the top portion of a mold intended for array-molding with structural features according to the invention.
Figure 4:
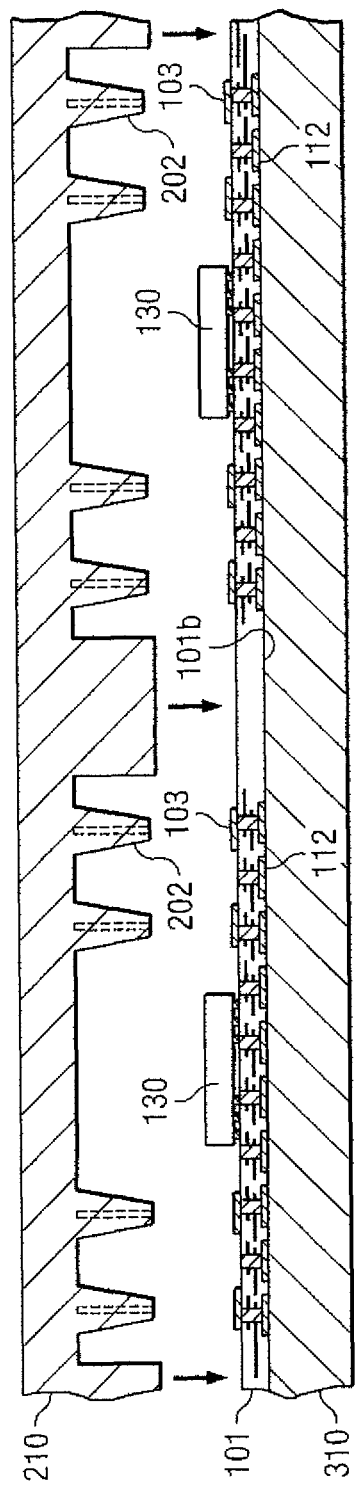

Another embodiment of the invention is an apparatus for the fabrication of a semiconductor device; the apparatus is illustrated in FIGS. 2B and 3B. A mold has top (201 in FIG. 2A, 210 in FIG. 2B) and bottom (301 in FIG. 3A, 310 in FIG. 3B) portions; the top portion has a cavity with protrusions for holding semiconductor devices, the bottom portion is without corresponding protrusions and preferably featureless. Preferably, the device includes a semiconductor chip attached to a sheet-like insulating substrate with contact pads in pad locations. When the mold is operated, it is closed by clamping the top portion onto the bottom portion, whereby a cavity is formed.

The top portion includes protrusions (202 in FIG. 2A) at locations matching the pad locations. Preferably, the protrusions are made of the same material (for instance, steel) as the top portion of the mold. The protrusions are preferably shaped as truncated cones of a height suitable to approach the pad metal surface in the closed mold; a practical distance from the cone to the pad surface is between 0 and about 100 μm. More preferably, the height is suitable to touch the pads metal surface in the closed mold. The angle 202a of the cones is preferably between 10 and 30 degrees from vertical. In addition, it is advantageous to add a ridge to the protrusions (203 in FIG. 2A), which are configured to create, in the molded encapsulation, a gas release channel in the aperture of the contact pads. The release channel provides an escape for air and other gases in the solder attachment process, when the aperture is being filled with solder.

The bottom portion of the mold is preferably featureless, in particular in molds for encapsulating whole arrays as shown in FIG. 3B. The bottom part provides support for placing the device substrate in the mold. On the other hand, it may be advantageous for molding discrete devices to have a recess (302 in FIG. 3A) of a certain depth in the bottom part for tightly positioning the device substrate. No molding compound reaches the bottom of the cavity or the bottom surface of the substrate.

Another embodiment of the invention is a semiconductor device, singulated by sawing from an array-molded substrate, and designed to become part of a semiconductor package-on-package device. An example of the embodiment is illustrated in FIG. 8C; a magnified cross section before singulation is depicted in FIG. 7. A sheet-like insulating substrate 101 has obtained its perimeter 820, preferably by sawing, which leaves recognizable saw marks. The substrate has a first surface 101a with a chip assembly site and contact pads 103 in pad locations and with a metal surface. The substrate further has a second surface 101b with attachment sites for solder bodies 701.

A semiconductor chip is attached to the assembly site (not shown in FIG. 8C); the attachment and assembly may be performed by wire bonding, as depicted in the example of FIG. 7, or by flip-chip technology, shown in FIG. 6B.

The embodiment has an encapsulated region, only on the top of the substrate and defined by the substrate perimeter 820. Consequently, the encapsulation material covers the whole top substrate area of the device, including the chip. The encapsulation forms contact apertures 703 at the pad locations for permitting external communication with the pad metal surfaces 103; preferably, the apertures have the shape of cones. The surfaces of the aperture sidewalls include compound structures, which have been modified from the otherwise smooth surface by the process employed to clean up the pad metal surfaces and thus bear witness of the selected process.

As an example, when the compound structures on the sidewalls include thermally modified compound particles, such as rounded particles, they indicate that a laser technique has been used to remove an incidental compound layer from the pad surface and thus expose the pad metal.

Alternatively, when the aperture sidewalls have a roughened surface, they indicate that a plasma clean-up process has been used to expose the pad metal.

In another situation, the aperture sidewalls may have surface structures recognizable by one skilled in the art as residues of a chemical etch process used to expose the pad metal.

In one row of apertures, FIG. 8C depicts elongated grooves in the contact apertures operable as gas release channels. While allowing trapped gas to escape in the process of reflowing a solder ball in the aperture, these grooves may end up being filled with solder. The support function is especially beneficial during the process step of attaching another semiconductor device 902 with solder bodies 910 to the first substrate surface of the first device 901 in order to produce a package-on-package semiconductor product as shown in FIG. 9. In this attachment process, the pad surfaces 103 are contacted by the solder bodies 910 of the second device 902, creating the package-on-package assembly. FIG. 9 stresses the preferred combination of devices, wherein not only the molding compound 920 of first device 901 extends to the substrate perimeter 901a, but also the molding compound 930 of second device 902 extends to the substrate perimeter 902a. This combination minimizes the risk of device warpage in the assembly process.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the metal protrusions of the top mold portion may be shaped as cylinders, cubes, rhomboids, or any other 3-dimensional configuration. It is therefore intended that the appended claims encompass any such modifications or embodiment.

We claim:

1. A method for fabricating a semiconductor device, said method comprising:
   providing a mold having
      a top portion and
      a bottom portion,
   the top portion including
      recesses suitable for a cavity and
      a plurality of protrusions shaped as truncated cones;
   placing a thin sheet of compliant inert polymer over the surface of the top portion;
   introducing a molding compound into the cavity to form a encapsulation body
      covering
      a semiconductor chip and
      linear arrays of contact pads adjacent to the chip, each conical protrusion matching a contact pad location,
   leaving a conical aperture in the encapsulation body over each contact pad corresponding to a conical protrusion in the cavity; and
   after partial polymerizing of the molding compound,
      the mold is opened and
      the encapsulated semiconductor chip is removed;
   wherein the thin sheet of compliant inert polymer is dissolved into the molding compound.

2. The method of claim 1, in which the semiconductor chip is disposed on a substrate.

3. The method of 2, in which the molding compound covers a first surface of the substrate on which the semiconductor chip is disposed and does not cover a second surface opposite the first surface.

4. The method of claim 3, in which a plurality of similar semiconductor chip are disposed on the first surface of the substrate.

5. The method of claim 4, further comprising a step of sawing the substrate along saw lines thus singulating the semiconductor chips.

6. The method of claim 5, in which the sawing cuts the substrate and the encapsulating body.

7. The method of claim 1, further comprising filling the apertures with solder material.

8. The method of claim 7, further comprising connecting a packaged second semiconductor device to the solder material.

9. The method of claim 8, further comprising connecting solder material to a second surface of the substrate.

* * * * *